United States Patent
Dunn et al.

(10) Patent No.: US 7,138,068 B2
(45) Date of Patent: Nov. 21, 2006

(54) PRINTED CIRCUIT PATTERNED EMBEDDED CAPACITANCE LAYER

(75) Inventors: Gregory J. Dunn, Arlington Heights, IL (US); Robert T. Croswell, Hanover Park, IL (US); Jaroslaw A. Magera, Palatine, IL (US); Jovica Savic, Downers Grove, IL (US); Aroon V. Tungare, Winfield, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/084,938

(22) Filed: Mar. 21, 2005

(65) Prior Publication Data

US 2006/0207970 A1    Sep. 21, 2006

(51) Int. Cl.
    *H01L 21/302* (2006.01)
(52) U.S. Cl. .......... 216/83; 257/773; 438/381; 438/778; 438/793; 438/794; 438/791
(58) Field of Classification Search .......... 216/83
    See application file for complete search history.

(56) References Cited

U.S. PATENT DOCUMENTS

| | | | | |
|---|---|---|---|---|
| 5,027,253 A | * | 6/1991 | Lauffer et al. | 361/321.4 |
| 5,261,153 A | * | 11/1993 | Lucas | 29/830 |
| 5,796,587 A | * | 8/1998 | Lauffer et al. | 361/763 |
| 6,005,777 A | * | 12/1999 | Bloom et al. | 361/766 |
| 6,183,880 B1 | * | 2/2001 | Yoshioka et al. | 428/607 |
| 6,346,335 B1 | * | 2/2002 | Chen et al. | 428/629 |
| 6,407,929 B1 | * | 6/2002 | Hale et al. | 361/763 |
| 6,541,137 B1 | * | 4/2003 | Kingon et al. | 428/701 |
| 6,660,406 B1 | * | 12/2003 | Yamamoto et al. | 428/615 |
| 2003/0113443 A1 | * | 6/2003 | Kingon et al. | 427/79 |
| 2004/0256731 A1 | * | 12/2004 | Mao et al. | 257/773 |
| 2006/0002097 A1 | * | 1/2006 | Borland et al. | 361/763 |

* cited by examiner

*Primary Examiner*—Nadine Norton
*Assistant Examiner*—Patricia A. George

(57) ABSTRACT

A method is disclosed for fabricating a patterned embedded capacitance layer. The method includes fabricating (1305, 1310) a ceramic oxide layer (510) overlying a conductive metal layer (515) overlying a printed circuit substrate (505), perforating (1320) the ceramic oxide layer within a region (705), and removing (1325) the ceramic oxide layer and the conductive metal layer in the region by chemical etching of the conductive metal layer. The ceramic oxide layer may be less than 1 micron thick.

11 Claims, 7 Drawing Sheets

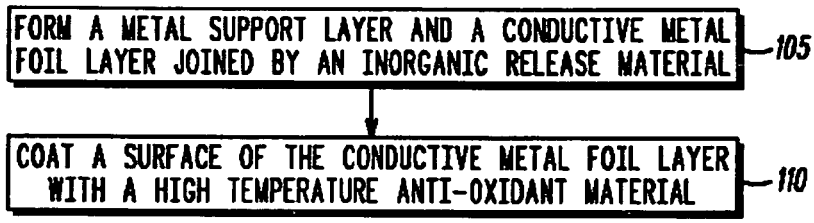
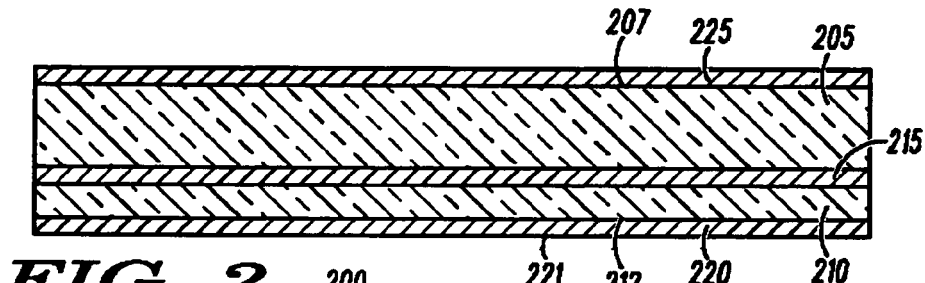
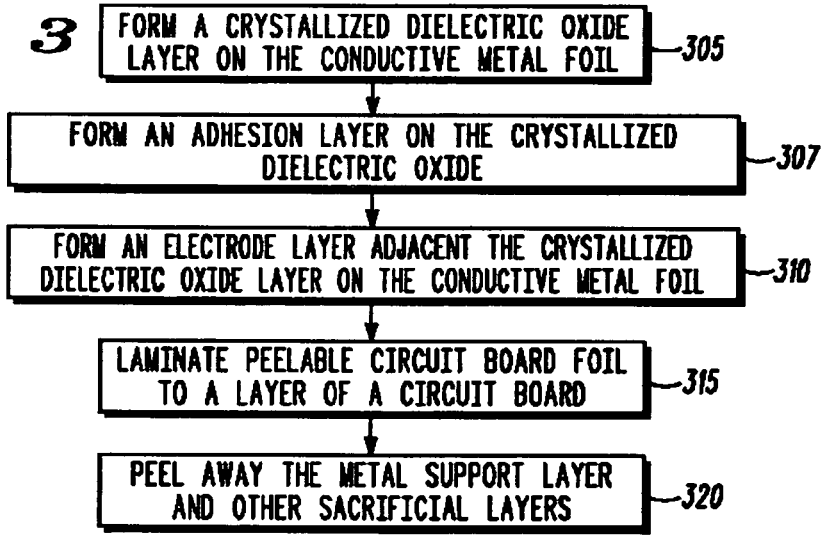
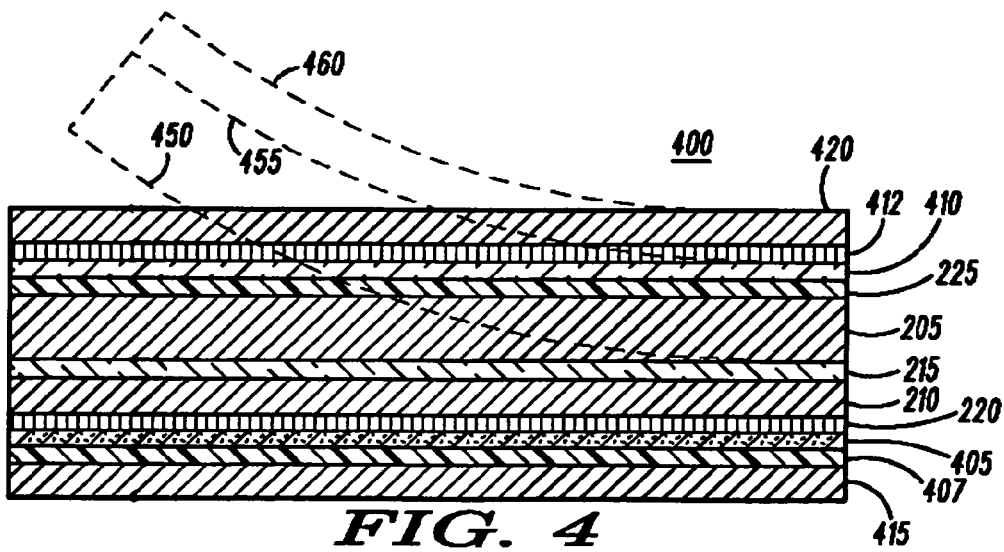

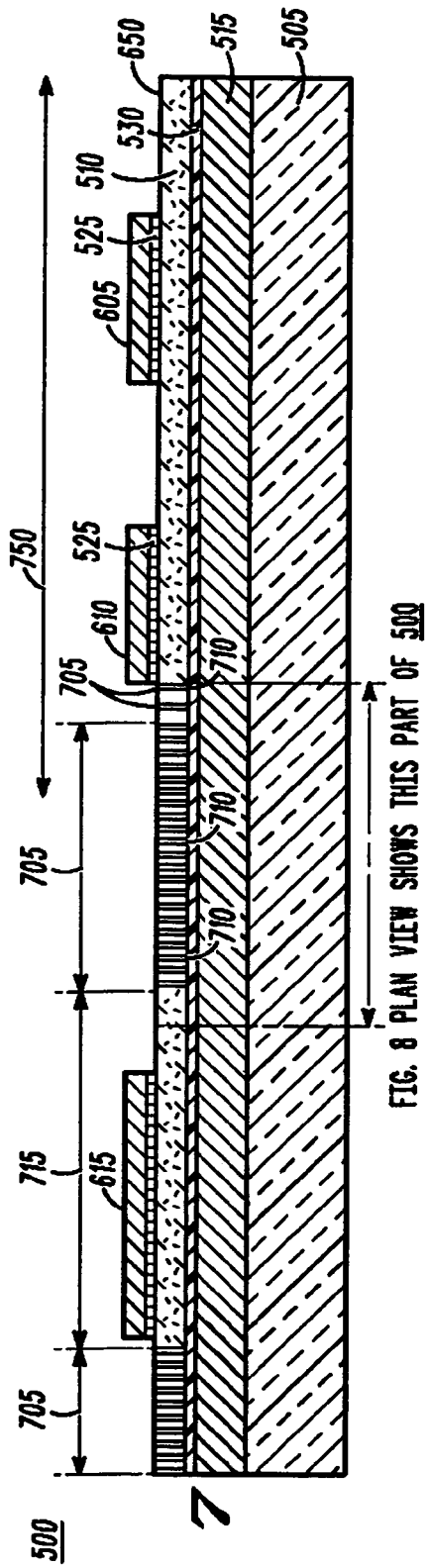
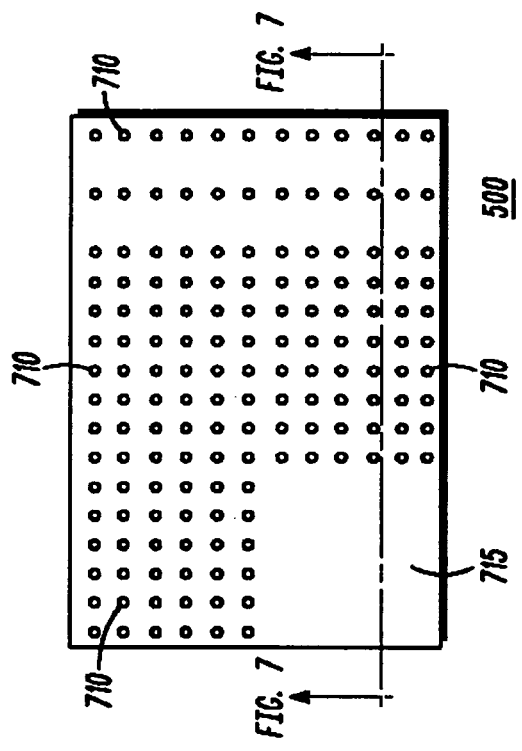
FIG. 7
FIG. 8

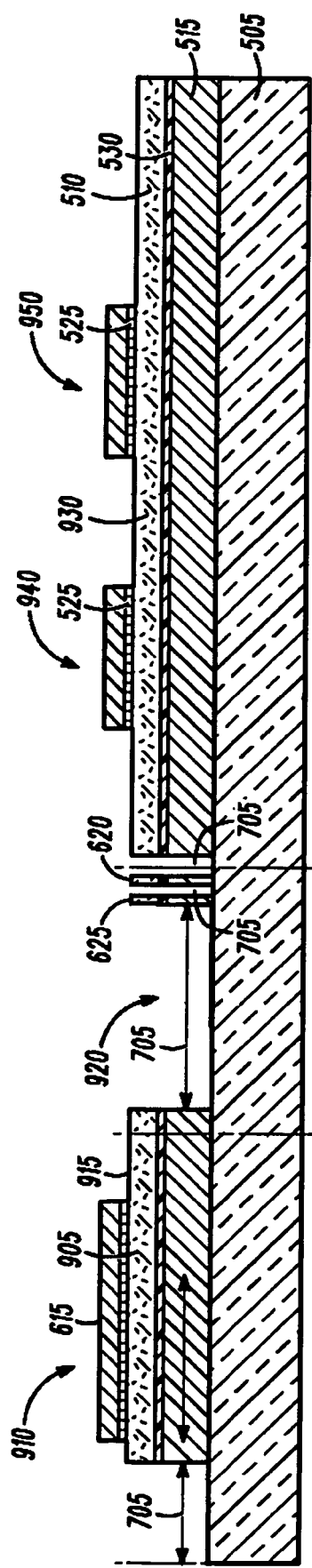
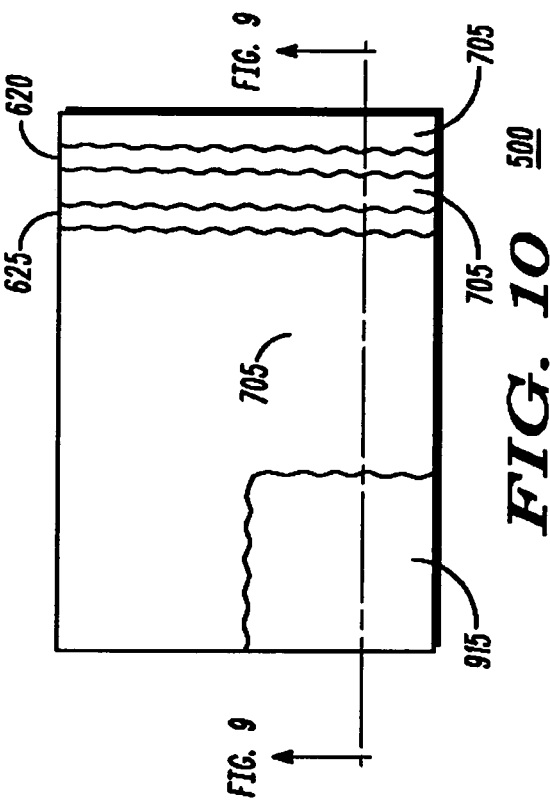
FIG. 9
FIG. 10

PRINTED CIRCUIT PATTERNED EMBEDDED CAPACITANCE LAYER

This application is related to a application entitled "PEELABLE CIRCUIT BOARD FOIL" U.S. Ser. No. 10/682,557 filed on Oct. 9, 2003, now U.S. Pat. No. 6,872,468, and application entitled "PRINTED CIRCUIT EMBEDDED CAPACITORS" U.S. Ser. No. 10/736,327 now U.S. Pat. No. 7,056,800, assigned to the assignee of the instant application.

FIELD OF THE INVENTION

The present invention generally relates to capacitors that are integrated or embedded in rigid or flexible single or multilayer circuit boards.

BACKGROUND

In the electronics art, smaller often means better. In the quest to provide smaller electronic appliances, the electronics industry seeks electronic components that are smaller than predecessor components.

The capacitor (a dielectric material sandwiched between two conductors) represents one electronic component that has substantially shrunk in this quest. However, current practice relies largely on individually mounting each capacitor onto solder paste on the surface of a circuit board and reflow soldering the capacitors. Despite the advances in capacitor miniaturization, each surface mounted capacitor still occupies a significant fraction of the circuit board surface area, and requires substantial cost to "pick and place" onto the board. For example, a typical cellular phone contains over 200 surface mounted capacitors connected to circuit boards by over 400 solder joints. The ability to integrate or embed capacitors in circuit boards during manufacture of the circuit boards would provide substantial space and cost savings over surface mounted capacitors. Unfortunately, efforts to make capacitors that can be integrated or embedded into circuit boards have either produced capacitors that do not have sufficient capacitance (e.g. <10 $pF/mm^2$) to replace many of the capacitors (e.g., requiring >100 pF capacitance) on a circuit board, or have resulted in structures and processes that have not been scaled up to manufacturing volumes.

Printed circuit boards typically comprise multiple layers of copper and glass-reinforced epoxy or other polymer. The copper is patterned to form the conducting elements of the circuit, and the polymer provides dielectric isolation and mechanical robustness. Polymers are low dielectric constant materials, and therefore parallel plate embedded capacitors formed within the polymer dielectric circuit board do not offer high capacitance density.

Although ceramic dielectrics that have very high dielectric constants are available, they are typically too rigid to be mechanically compatible with organic printed circuit boards. Further, organic printed circuit boards are incompatible with the methods used to form the ceramic dielectric films. Ceramic dielectric films are commonly formed by a broad range of deposition techniques, such as chemical solution deposition (CSD), evaporation, sputtering, physical vapor deposition and chemical vapor deposition. However, in order to achieve the requisite dielectric structure, such techniques typically require either a high-temperature deposition or a high-temperature crystallization. Such temperatures would melt, ignite or otherwise degrade the organic materials in the circuit board substrate.

Furthermore, these processes are incompatible with copper. At the high temperatures and oxidizing conditions needed to form the ceramic dielectric, copper oxidizes at the interface between the ceramic dielectric and the copper. This effectively forms an interface layer that will degrade the overall device performance, thus negating any advantage gained by the use of the ceramic dielectric. The copper would not oxidize as readily in a reducing atmosphere, but such an atmosphere would produce excessive defect concentrations in the dielectric oxide layer and may frustrate phase formation. Also, the copper would not oxidize as readily at lower temperatures, but efforts to form ceramic films at temperatures that are compatible with circuit board components have generally compromised the dielectric properties of the resulting ceramic. For ceramic dielectrics, it is apparent that favorable dielectric properties are intimately linked to a complex crystal structure (e.g., perovskite) that is difficult to develop at lower temperatures.

Dielectric oxides such as lead zirconate titanate (PZT) and lead lanthanum zirconate titanate (PLZT) belong to a particularly promising class of high permittivity ceramic dielectrics with the perovskite crystal structure. When formed by the CSD process, dielectric oxides can be made into very thin, flexible, robust layers with very high dielectric constants.

Several methods have been proposed to create a thin structure that is intended to be added to a circuit board using compatible circuit board layering techniques, by adding a thin coating of dielectric oxide to a thin foil of copper. Although some aspects of how such a material would be manufactured, integrated into a circuit board structure, and patterned have been described, improvements that use these methods in unique ways for a wide variety of applications are desirable.

What is needed is a structure and process for adding capacitors formed of high dielectric constant materials to rigid or flexible circuit boards that are economical to manufacture and wherein the structure is in a form compatible with multilayer circuit board fabrication techniques that are in wide use today.

BRIEF DESCRIPTION OF THE DRAWINGS

The present invention is illustrated by way of example and not limitation in the accompanying figures, in which like references indicate similar elements, and in which:

FIG. 1 is a flow chart that shows a method for fabricating a peelable circuit board foil in accordance with some embodiments of the present invention;

FIG. 2 is a cross section diagram of the peelable circuit board foil fabricated by the method described with reference to FIG. 1;

FIG. 3 is a flow chart that shows a method for fabricating a peelable circuit board foil in accordance with some embodiments of the present invention;

FIG. 4 is a cross section diagram of the peelable circuit board foil fabricated by the method described with reference to FIG. 3;

FIGS. 5–12 are cross sectional and plan views of the top layer of small portions of a printed circuit sub-structure that include one or more isolated, large value embedded capacitors in various stages of fabrication, in accordance with some embodiments of the present invention;

Figure 5:
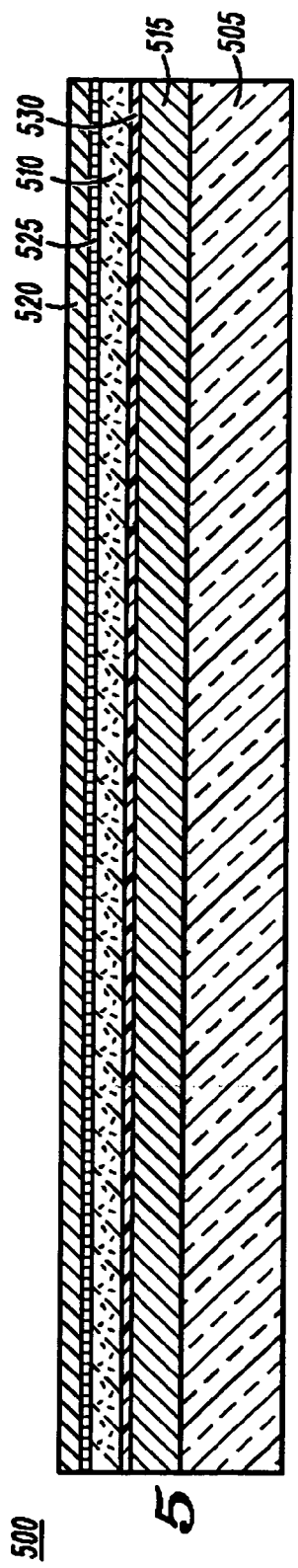

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular printed circuit embedded capacitors in accordance with embodiments of the present invention, it should be observed that embodiments of the present invention reside primarily in combinations of method steps and apparatus components related to embedded capacitors for circuit boards. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

The unique isolated embedded capacitors of the embodiments of the present invention may be formed starting with a dielectric coated foil that is applied to a sub-structure of a printed circuit board that when completed comprises at least two substrate layers, or may be formed using other techniques that provide a thin ceramic oxide layer on a printed circuit board, whether the techniques are conventional or unknown at this time. The fabrication of the completed printed circuit board (also called herein a printed circuit structure) including the embedded capacitors of some embodiments of the present invention that use a foil is compatible with printed circuit board materials that would typically be substantially degraded if attempts to crystallize the dielectric materials were performed in situ on the printed circuit board sub-structure itself. The technique used for embodiments of the present invention is compatible with commonly used printed circuits that need only withstand the processes typically used for printed circuit soldering. For example, the technique is fully compatible with the printed circuit material known as FR-4, which passes a 10 second solder dip test at 288 degrees Centigrade and has a degradation temperature of 300 degrees Centigrade. Moreover, the technique is fully compatible with printed circuit materials such as FR-4 that typically have a surface roughness on the order of microns, and is therefore distinguished from prior art techniques, especially those involving vacuum deposition of thin (<1 micron) films on polymers such as Teflon and polyimide that, while offering higher temperature compatibility and smoother surfaces, are more expensive than FR-4 and substantially more difficult to metallize and process.

The technique in accordance with some embodiments involves the use of a foil that includes a crystallized dielectric oxide material that is applied to the printed circuit sub-structure after the dielectric oxide is applied to a metal foil layer and then crystallized, at temperatures up to 600 degrees Centigrade. One method of fabricating such a foil is described in some detail with reference to FIGS. 1–4; other methods could be used. One example of another method is described in U.S. Publication 2003/0113443A1, published on Jun. 19, 2003. While the electrodes formed by the methods described with reference to FIGS. 1–4 are relatively thin (on the order of 25 microns or less), other methods could result in a foil having a thickness of at least one electrode layer that is up to approximately 70 microns.

FIGS. 5–12 describe in some detail the formation of embedded capacitors in the printed circuit structure, in accordance with some embodiments of the present invention.

Referring to FIG. 1, a method for fabricating a peelable circuit board foil 200 is shown, in accordance with some embodiments of the present invention. A cross sectional view of the peelable circuit board foil 200 is shown in FIG. 2. At step 105 (FIG. 1) a metal support layer 205 (FIG. 2) and a conductive metal foil 210 (FIG. 2) are formed that are joined at first surfaces using an inorganic release material 215 (FIG. 2). This inorganic release material 215 retains its ability to separate the two metal layers 205, 210 after exposure to high temperatures (used to add a crystallized dielectric layer to the peelable circuit board foil 200, as described below with reference to FIGS. 3 and 4). The inorganic release material consists essentially of a co-deposited admixture of a metal and a non-metal, and may be formed using known techniques such as those described in U.S. Pat. No. 6,346,335,B1 issued to Chen et al. on Feb. 12, 2002. In accordance with some embodiments of the present invention, the metal support layer 205 may be between 10 and 75 microns thick, and for most uses is between 30 and 70 microns thick; the conductive metal foil 210 may be between 5 and 25 microns thick and for most uses is between 10 and 20 microns thick; and the inorganic release material may be less than 0.030 microns thick. Because some embodiments of the present invention are for fabrication of a dielectric coated foil (and, ultimately, the formation of capacitors in a layer or layers of multi-layer printed circuit boards), the conductive metal foil 210 of some embodiments of the present invention is normally thicker than that used for conventional metal foils having a release layer (for example, see U.S. Pat. No. 6,346,335). The optimum metal for the metal support layer 205 and the conductive metal foil 210 for most applications is copper or a copper alloy, but other metals such as nickel or a nickel alloy could be used.

At step 110 (FIG. 1), a second surface 212 of the metal foil layer 210 may be coated with a high temperature ant-oxidant barrier 220 (FIG. 2), and the resulting coated second surface (221) has a surface roughness less than 0.05 micron root mean square (RMS). The high temperature anti-oxidant barrier 220 is one that is effective to prevent any substantial oxidation of the conductive metal foil 210 during a later step in which a dielectric oxide is applied, pyrolyzed, and crystallized by known techniques, at temperatures as high as about 600 degrees centigrade, and has performance benefits compared to typical anti-tarnish coatings used for conventional peelable circuit board foils that perform well at temperatures below 100 degrees centigrade.

This high temperature anti-oxidant barrier may be deposited on the conductive metal foil 210 by sputtering, electroless plating or electrolytic plating materials that may be selected from palladium, platinum, iridium, nickel, or alloys or compositions that include any combination of these metals with other materials, for example, minor amounts of aluminum, phosphorus, or other materials using known techniques that will achieve a surface roughness of less than 0.05 micron RMS, and which will typically achieve a surface roughness less than 0.01 micron RMS.

Typically, the technique chosen to coat the conductive metal foil layer 210 will result in a second surface 207 (FIG. 2) of the metal support layer 205 also being coated with the same high temperature antioxidant barrier 225 (FIG. 2) to about the same thickness, but this is not a required result for some embodiments of the present invention. For example, an acceptable alternative technique would comprise masking the second surface of the metal support layer 205 with a resist or other polymer material during the plating step so that the high temperature antioxidant barrier is applied to only the conductive metal foil 210, leaving the metal support layer 205 uncoated. In contrast to conventional peelable circuit board foils, for example the CopperBond® Thin Copper Foil distributed by Olin Corporation Metals Group of Waterbury, Conn., for which the exposed surface of the conductive metal foil may be intentionally roughened by a dendrite forming process, the resulting surface of the conductive metal foil 210 of some embodiments of the present invention is kept smooth, with a roughness measurement less than 0.05 microns root mean square (RMS), and more preferably less than 0.01 micron RMS. Such smoothness can be achieved by known techniques that are used to form the conductive metal foil 210 and the high-temperature antioxidant barrier 220. The peelable circuit board foil 200 formed by the method described with reference to FIG. 1 is conveniently able to be made in sizes commensurate with conventional printed circuit boards and handled and shipped without having to use expensive techniques to protect it from wrinkling or tearing during shipment, handling, and processing.

Referring now to FIG. 3, a method for fabricating a dielectric coated peelable circuit board foil 400 from the peelable circuit board foil 200 is shown, in accordance with some embodiments of the present invention. A cross sectional view of the dielectric coated peelable circuit board foil 400 is shown in FIG. 4. At step 305, a crystallized dielectric oxide layer 405 (FIG. 4) is formed adjacent to the conductive metal foil 210 of a peelable circuit board foil 200. Specific examples of the crystallized dielectric oxide according to this invention include lead zirconate titanate (PZT), lead lanthanide zirconate titanate (PLZT), lead calcium zirconate titanate (PCZT), lead lanthanide titanate (PLT), lead titanate (PT), lead zirconate (PZ), lead magnesium niobate (PMN), barium titanate (BTO), strontium titanate (STO), and barium strontium titanate (BSTO). Lead based dielectric oxides comprising the PZT system, particularly compositions comprising the PCZT formula $PbCa_x(Zr0_{0.52}Ti_{0.48})O_3$, where x is from 0.01 to 0.1, are particularly attractive. The addition of small quantities of elements such as Ni, Nb, Ca and Sr in compounds that do not specifically name them can also improve electrical performance. Accordingly, the dielectric oxides of some embodiments of the present invention may also contain small quantities of Ni, Nb, Ca and Sr.

The crystallized dielectric oxide is formed at step 305 by one of a broad range of deposition techniques, such as chemical solution deposition (CSD), evaporation, sputtering, physical vapor deposition and chemical vapor deposition. These techniques typically require either a high-temperature deposition or a high-temperature crystallization, and result in a crystalline coating on the conductive metal foil 210 that is polycrystalline in form and quite flexible, while maintaining excellent dielectric properties for forming capacitors even when flexed. An economical, well-known technique that can be used for forming the crystalline dielectric oxide layer is to use CSD. Another economical technique for forming the crystalline dielectric oxide layer is powder coating using a powder or powder suspension. The crystallized dielectric oxide material formed by these techniques is most often of a polycrystalline nature, as is well known in the art. The crystallized dielectric oxide layer 405 may be formed with a thickness from about 0.1 to about 1 micron. When the crystallized dielectric oxide layer 405 is PCZT, it may be formed to be 0.2–0.6 micron thick for many uses, and will provide capacitance densities that exceed 1000 picoFarad per square millimeter (1000 $pF/mm^2$), and that are typically 3000 $pF/mm^2$ or more, while still providing high production yields and necessary breakdown voltages (e.g., greater than 5 volts). The values of capacitance used throughout this document are specified at 1 Megahertz, unless otherwise stated. When the crystallized dielectric layer is formed by the cost effective methods of CSD or powder coating at thicknesses less than 0.2 microns thick, defects tend to arise in the form of pinhole shorts between the conductive metal foil 210 and the electrode layer 415. Other techniques, such as sputtering, may allow thinner crystallized dielectric oxide layers, but they are much less economical and the layer may be too thin to withstand handling. The dip coating technique and other techniques may also result in the formation of a sacrificial crystallized dielectric oxide layer 410 adjacent the metal support layer 205, but this layer is not required for some embodiments of the present invention. For some coating techniques, allowing the formation of the sacrificial crystallized dielectric oxide layer 410 on the metal support layer 205 is projected to be less costly than attempting to prevent its formation, and serves to reduce curling of the foil layer that may result when only the crystallized dielectric oxide layer 405 is formed.

The peelable circuit board foil 400 formed by the method described with reference to step 305 of FIG. 3 can be conveniently made in sizes commensurate with conventional printed circuit boards and handled and shipped without having to use expensive techniques to protect it from wrinkling or tearing during shipment, handling, and processing. This peelable circuit board foil 400 can then be used to apply the dielectric layer 405 and the conductive metal foil layer 210 within (or on) a flexible or rigid printed circuit board stack to form capacitors having different dielectric areas. This is done by adhering the dielectric layer 405 of the peelable circuit board foil 400 to a conductive metal layer surface of a flexible or rigid printed circuit board stack using an appropriate conductive adhesive material or other known technique, then peeling away the metal support layer 205, the sacrificial crystallized dielectric oxide layer 410, and the high temperature anti-oxidant barrier 225 as indicated by the dotted lines 450, 455 in FIG. 4, followed by well known etching and metal deposition steps that form individual capacitors. In one embodiment, a single capacitor is formed within an entire layer of the printed circuit board, such as for a power source layer.

At step 307 (FIG. 3), the exposed surface of the dielectric oxide layer 405 may be coated with an adhesion layer 407 (FIG. 4), which need only be as thick as necessary to provide sufficient adhesion of an electrode layer that is applied in a later step to the dielectric oxide layer 405. In some embodiments, the adhesion layer comprises titanium tungsten (TiW), which may be only a fraction of a micron thick. This adhesion layer 407 may be deposited on the conductive metal foil 210 by sputtering, electroless plating or electrolytic plating. The technique chosen to coat the dielectric oxide layer 405 may result in the sacrificial crystallized dielectric oxide layer 410 also being coated with the same adhesion material to about the same thickness, resulting in a sacrificial adhesion layer 412, but this is not a required result for some embodiments of the present invention.

Referring again to FIGS. 3 and 4, at step 310 (FIG. 3), an electrode layer 415 (FIG. 4) may be adhered to the crystallized dielectric layer 405 by the adhesion layer 407, using a well-known technique such as sputtering or electroless plating or electrolytic plating. A typical thickness for the electrode layer 415 is 2 to 20 microns. Depending on the technique used to apply the electrode layer 415, a sacrificial electrode layer 420 of approximately the same thickness as the electrode layer 415 may also be formed, adjacent the crystallized dielectric layer 410 on the metal support layer 205 (i.e., on the surface of the crystallized dielectric layer that is opposite the metal support layer 205), but this is not required for some embodiments of the present invention.

The peelable circuit board foil with the electrode layer 415 can be laminated to a circuit board substrate at step 315 (FIG. 3), e.g., by pressing onto a prepreg layer (glass-reinforced B-stage epoxy), which is a well-known technique that uses pressure and temperature to flow and then cure the epoxy. When the metal support layer 205 is peeled away from the conductive metal foil layer 210 at step 320 (FIG. 3), the sacrificial electrode layer 420, if present, is also peeled away, as shown by dotted lines 450, 460 in FIG. 4.

By now it should be appreciated that the peelable circuit board foils 200, 400 and the processes to fabricate them provide foils that economically facilitate the addition of capacitors to flexible and rigid circuit boards. The inorganic release layer remains effective after exposure to the high temperatures of pyrolysis and crystallizing; the peelable metal support layer and double layers of crystallized dielectric oxide (in one embodiment) help provide a foil that is formed flat and does not wrinkle or crease, and the sacrificial metal support and dielectric oxide layers may be easily removed during the process of adding a capacitive layer to a circuit board using some embodiments of the present invention.

In accordance with some embodiments of the present invention, the technique of providing a ceramic oxide layer that is a crystallized dielectric oxide layer described above with reference to FIGS. 1–4 is but one technique that may be used in embodiments of the present invention to provide a thin ceramic oxide layer that is embedded in a printed circuit board.

FIGS. 5–13 are cross sectional views, plan views, and a flow chart that illustrate the fabrication of embedded capacitors within a printed circuit structure, in accordance with some embodiments of the present invention. FIG. 5 is a cross sectional view of the top layer 505 of a small portion of a printed circuit sub-structure 500 having a layer that is presently a top layer 505, to which a first electrode layer 515 and an embedded ceramic oxide layer 510 have been applied. The top layer 505, or, the top layer as well as layers underneath the top layer (not shown in this document) is also referred to as the substrate, or printed circuit substrate, for purposes of embodiments described herein. The embedded ceramic oxide layer 510 may be applied, but need not necessarily be applied, as a crystallized dielectric layer of a foil that is fabricated as described above with reference to FIGS. 1–4. When a foil is used such as that described with reference to FIG. 4, layer 525 may be an ant-oxidant layer and layer 530 may be an adhesion layer, but otherwise one or both layers 525, 530 may not be present. In some embodiments, layers 525, 530 may comprise other materials between a second electrode layer 520 and the ceramic oxide layer 510, and between the ceramic oxide layer 510 and the first electrode 515. In one example, a foil is applied that has an anti-oxidant layer and an adhesion layer in reversed order to those shown in FIG. 4. In this example, layer 525 is an adhesion layer comprising TiW and layer 530 is an antoxidant layer comprising nickel. The second electrode layer 520 may be formed overlying the ceramic oxide layer 510 by conventional or new techniques. The embedded ceramic oxide layer 510 is typically less than 1 micron thick, and is a dielectric material having a dielectric constant of at least 300 pF/mm$^2$. The term "sub-structure" refers to the printed circuit board during the various stages of fabrication. The printed circuit layers may be formed of commonly used printed circuit board materials such as FR-4, but the present invention is also compatible with most available multi-layer printed circuit materials. In accordance with some embodiments of the present invention, a dielectric coated foil is applied to the surface of the top layer 505 by one of several techniques. In several of the techniques, the top layer 505 is a well-known "pre-preg" layer. In one technique the surface of the first electrode layer 515 is intentionally roughened, such as by the dendritic growth method described above, the foil is applied to the pre-preg layer, and the printed circuit substructure is treated to complete the adhesion process. In another technique in which the surface of the first electrode layer 515 is smooth, an adhesion promotion substance is applied to the surface of the first electrode layer 515 and then it is applied to the pre-preg layer and the printed circuit substructure is treated to complete the adhesion process.

Figure 13:
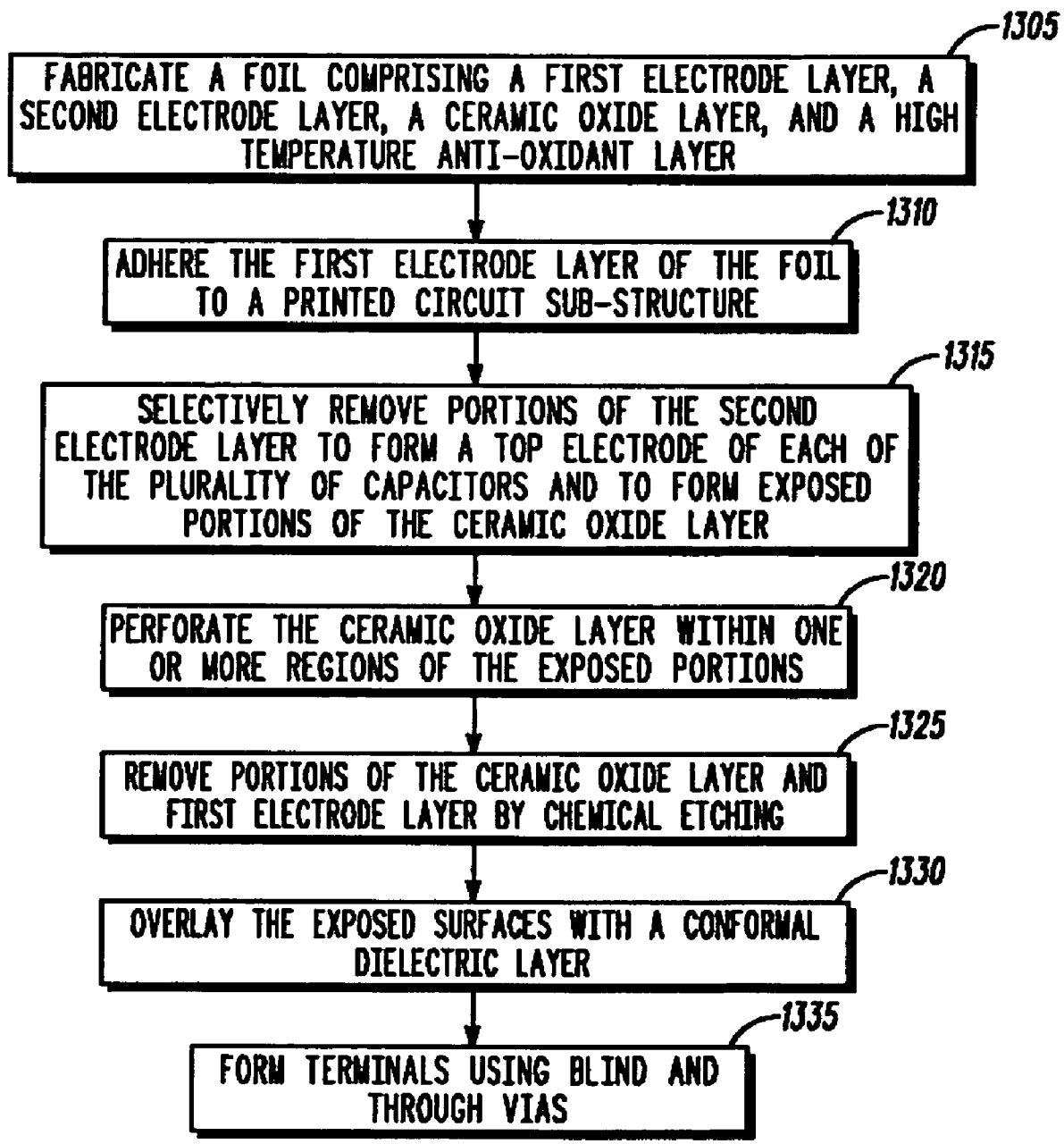
FIG. 13 is a flow chart showing some steps used to fabricate a printed circuit sub-structure that includes an embedded capacitance layer, in accordance with some embodiments of the present invention.

Some steps of the process as it has been generally described so far are shown in FIG. 13, in accordance with some embodiments of the present invention. At step 1305 (FIG. 13), a dielectric coated foil such as foil 400 of FIG. 4 is fabricated that comprises an electrode layer 415, a conductive metal foil 210, and a crystallized dielectric oxide layer 405 disposed between the electrode layer 415 and the conductive metal foil 210 The dielectric coated foil 400 may further comprise a high temperature anti-oxidant layer (e.g., 220) and/or an adhesion layer (e.g, 407) as shown in FIG. 4. In some embodiments, the crystallized dielectric oxide layer 405 comprises crystallized lead calcium zirconate titanate and may be less than 1 micron thick and have a capacitive density greater than 1000 pF/mm$^2$. At step 1310 (FIG. 13), the electrode layer 415 of the foil 400 is adhered to a top layer 505 of a printed circuit sub-structure 500. The electrode layer 415 of the foil 400 forms a first electrode layer 515 of the printed circuit sub-structure 500, the conductive metal foil 415 forms a second electrode layer 520 of the printed circuit sub-structure 500, and the crystallized dielectric oxide layer 405 forms a ceramic oxide layer 510 of the printed circuit substructure 500. Other means could be used to form the first electrode layer 515, the second electrode layer 520, and the ceramic oxide layer 510 of the printed circuit substructure 500. When the foil 400 is used to form the printed circuit substructure 500, an antioxidant layer. Layers 525, 530 of the printed circuit substructure 500 represent layers such as the high temperature antioxidant layer 220 and adhesion layer 407 described above with reference to FIG. 4, or other inter-layers formed when other, conventional or new, means are used to fabricate a printed circuit sub-structure 500. It will be appreciated that when a ceramic oxide layer other than the type described with reference to FIGS. 1–4 is used in some embodiments of the present invention, a high temperature anti-oxidant layer may be formed between and contacting the first electrode layer 515 and the ceramic oxide layer 510 instead of, or in addition to, being between and contacting the second electrode layer 520 and the ceramic oxide layer 510, or may not be present. In some embodiments, the ceramic oxide layer 510 may be formed by other known or new techniques that do not specifically use the steps 1305, 1310 described above.

Steps 1305, 1310 represent a specific example of fabricating a ceramic oxide layer 510 that overlies an electrode layer (conductive metal layer) 515 that overlies a printed circuit substrate 505. In some embodiments, the ceramic oxide layer 510 may comprise other dielectric materials that may be somewhat thicker, such as up to 2 microns.

Figure 6:
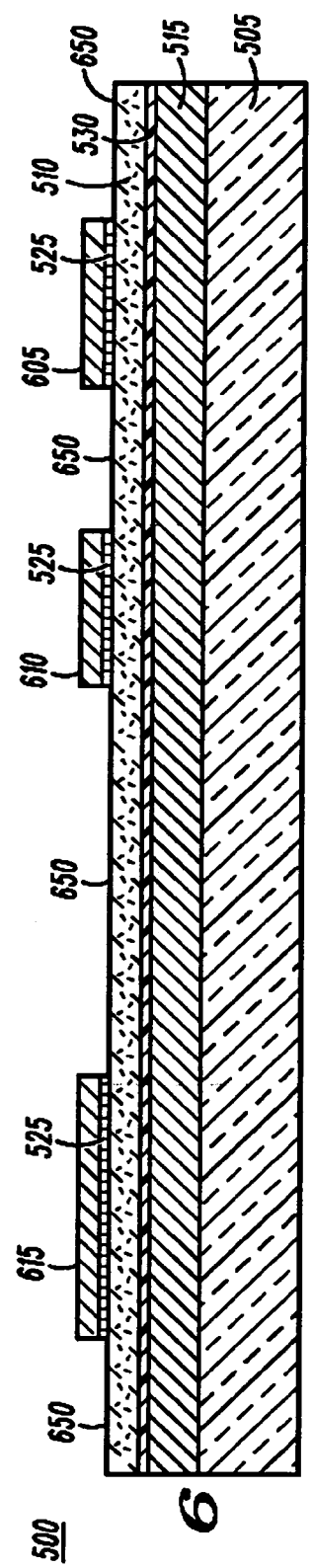
Figure 14:
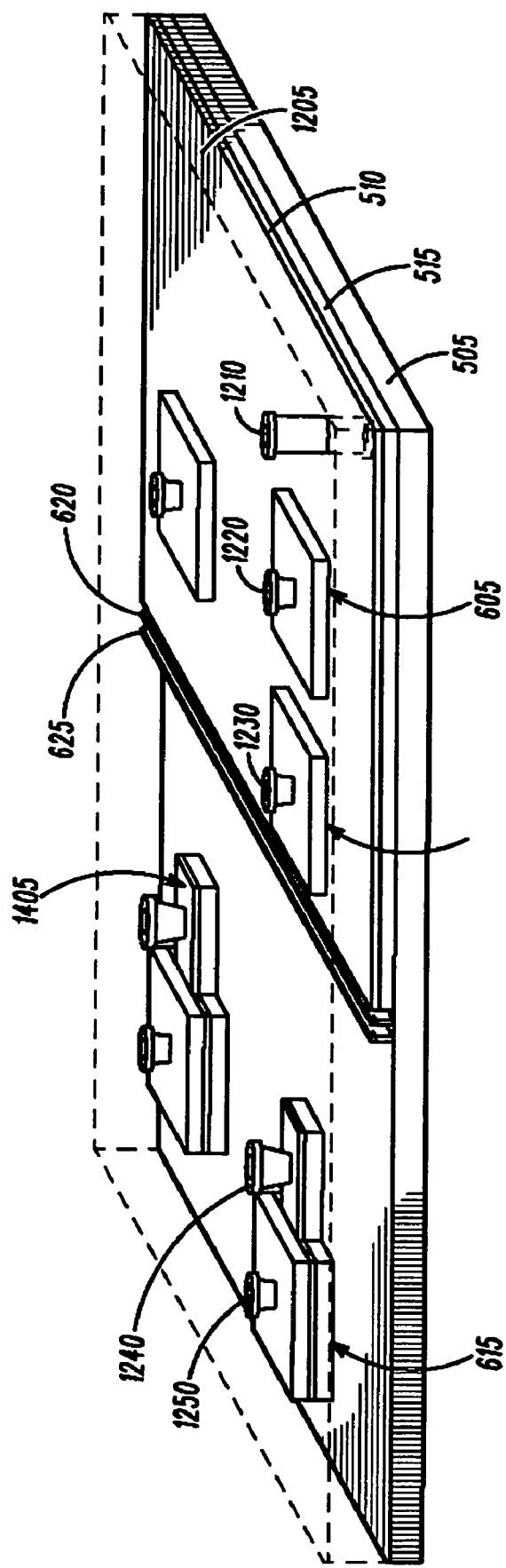
FIG. 14 is a perspective view showing a printed circuit sub-structure that includes the printed circuit sub-structure described with reference to FIGS. 5–11, in accordance with some embodiments of the present invention.

At step 1315 (FIG. 13), portions of the second electrode layer 520 and high-temperature antioxidant layer 525 (if present), are selectively removed to form a top electrode 605, 610, 615 of each of a plurality of capacitors and to form exposed portions 650 of the ceramic oxide layer 510. The well-known technique of photolithographic patterning and etching as commonly practiced by printed circuit manufacturers may be used for this selective removal. FIG. 6 is a cross sectional view of the portion of the printed circuit sub-structure 500 in accordance with some embodiments of the present invention after step 1315 has been completed. In this example, the three top electrodes 605, 610, 615 have been produced by the etching the second electrode layer 520 and the antioxidant layer 525 (if present). The three dimensional shapes of these electrodes may be better understood by viewing FIG. 14, which is a perspective drawing of the portion of the printed circuit sub-structure 500 after the steps described herein illustrating finished capacitors (and some additional steps) completed prior to solder mask application. The printed circuit sub-structure 500 may not be complete at that point, because additional layers may be added that may include additional embedded capacitors, or if no more layers are added, surface mount parts such as integrated circuits may be added. The removal of the portions of the second electrode layer 520 and anti-oxidant layer 525 exposes the portions 650 of the ceramic oxide layer 510.

At step 1320 (FIG. 13), regions 650 of the ceramic oxide layer 510 are perforated within regions 705 (FIG. 7) of the exposed portions 650 of the crystallized dielectric layer 510. When the printed circuit sub-structure 500 includes the anti-oxidation layer 525 or an inter-layer of another type, such inter-layer may be removed as a step in the process used to pattern the second electrode layer 520, or the perforations must also go through such an inter-layer. This may be done by an appropriate choice of etchants and/or laser techniques. For example, when the inter-layer is several microns of nickel, it may be removed during the etching process used for patterning the top electrode layer 520. When the inter-layer is TiW less than a tenth of a micron thick, it may be perforated by mechanical abrasion or by laser ablation also used for perforation of the ceramic oxide layer 510. FIG. 7 is a cross sectional view of the portion of the printed circuit sub-structure 500 and FIG. 8 is a plan view of a sub-section of FIG. 8 of the printed circuit sub-structure 500, in accordance with some embodiments of the present invention, after step 1320 has been completed. The perforated regions 705 may include a circumscribing portion around non-perforated regions such as 715 (FIG. 7), 1405 (FIG. 14) that are ultimately fabricated to include isolated capacitors, in order to effect a physical isolation of the isolated capacitors from other portions of the ceramic oxide layer 510 when subsequent steps of the technique are completed (of which some embodiments are described below).

The perforating holes that form the perforated regions 705 may be formed by a technique such as mechanical abrasion or laser ablation. Examples of known mechanical abrasion techniques that may be used are those referred to as sandblasting, liquid jet, and ultrasonic abrasion. Laser ablation techniques that are commonly used by fabricators of conventional multilayer printed circuit boards are carbon dioxide ($CO_2$) and ultraviolet (UV) laser ablation. Using any of these techniques may make the perforation process very economical, with a choice being dependent on materials used in the ceramic oxide layer 510, the first electrode layer 515, and any inter-layers between them, such as an adhesion or anti-oxidation layer. $CO_2$ lasing ablates holes in the ceramic oxide layer 510 without substantially affecting the electrode layer 515 and certain interlayer materials. UV lasing ablates holes through both the ceramic oxide layer 510 and the first electrode layer 515, and may also ablate holes in certain inter-layer materials, such as nickel and TiW. Use of any of these techniques may generate perforation holes 710 (FIGS. 7 and 8) that range in diameter from 10 microns to 100 microns. (As a reminder, objects in FIGS. 7 and 8 are not necessarily drawn to accurate scale). The perforation holes 710 may be effective when they are arranged to remove only a fraction of the area of the region that is perforated, such as fractions within a range from 0.05 to 0.50, depending on the materials and thicknesses of the ceramic oxide layer 510 and the first electrode layer 515. Of course, larger fractions will also work effectively but may increase fabrication costs.

At step 1325 (FIG. 13), the first electrode layer 515 and the ceramic oxide layer 510 within the perforated regions 705 are removed by chemical etching. In some embodiments of the present invention, isolated capacitors are thereby formed. Conventional printed circuit techniques using photolithographic patterning and chemical etching may be used to accomplish removal of the electrode layer 515 within the perforated regions 705. The chemical etching may be performed using conventional resists and etchants used for conventional printed circuit board fabrication, such as photodefinable dry film resist and a cupric chloride or ammoniacal etch. In embodiments in which the electrode layer is essentially unaffected by the technique used to form the perforation holes 710, the etchant reaches the surface of the first electrode layer 515 through the perforation holes 710, dissolves the electrode material within the area of the perforation holes, and also attacks the electrode material laterally, under the ceramic oxide layer 510 between the perforation holes, removing the electrode material there as well as the electrode material within the holes. In embodiments in which the electrode layer is essentially removed within the perforation holes by the technique used to form the perforation holes 710, the etchant flows into the perforation holes and dissolves the electrode material laterally, under the ceramic oxide layer 510 between the perforation holes, removing the electrode material there as well as the electrode material within the holes. The removal of the metal electrode material under the ceramic oxide material between the perforation holes leaves voids that weaken the structure of the ceramic oxide material over the voids, when the ceramic structure is sufficiently thin, and the ceramic material over the voids breaks apart and washes away when the resulting used etchant mixture is washed away. The maximum thickness of the ceramic material for which these embodiments work well is dependent on the strength of the ceramic material, which may vary for different combinations of elements and for differing extents of crystallization of the ceramic material, but is typically less than 1 micron. The removal of the electrode material and the ceramic material in the perforated regions can be said to be done essentially simultaneously, since the removal of the ceramic oxide material is caused by the chemical etching that accomplishes electrode material removal.

Referring to FIG. 9, a cross sectional view of the portion of the printed circuit sub-structure 500 is shown in accordance with some embodiments of the present invention after step 1325 has been completed. A corresponding plan view of a sub-section of FIG. 9 of the printed circuit sub-structure 500 is shown in FIG. 10. The non-perforated areas of the exposed portions 650 of ceramic oxide layer 510 that remain after etching typically include at least one isolated ceramic oxide area (called herein an isolated dielectric core) 905 that is large enough to form an isolated capacitor 910 and to provide an additional lateral area 915 where an electrical connection can be formed to the portion of the first electrode forming a bottom electrode 925 under the isolated dielectric core 905, using a via. Other portions of the ceramic oxide layer 510 and the first electrode layer 515 that remain after etching are the areas 930 that are under and connect capacitors such as 940, 950 that share a first electrode, which in some cases may be a ground electrode, and circuit runners such as 620, 625.

When a laser is used to perforate the ceramic oxide layer 510, two options are available for determining which portions 905 of the ceramic oxide layer 510 are preserved. One option is to program the laser so that this region is not perforated. A second option is to simplify laser programming for running a laser that is used to form the perforations in step 1320 (refer to FIGS. 13 and 7) by forming perforations throughout, and then protect portion 905 with resist during the etch step. The ceramic oxide layer 510 and the first electrode layer 515 are removed only in regions which are both perforated in the lasing step, and exposed by the patterned resist during the etch step. When a $CO_2$ laser is used, laser programming may be further simplified by activating the laser all the time, even when it is over portions of the top electrode 615, because a $CO_2$ laser will not perforate the top electrode layer under typical circumstances. When a UV laser is used, it must be programmed to be activated only where perforations are needed, as it may also perforate the second electrode layer when it is activated at locations where the top electrode layer is preserved.

Similarly, when mechanical abrasion is used to perforate the ceramic oxide layer 510, two options are available for determining which portions 905 of the ceramic oxide layer 510 are preserved. One option is to protect portions 905, for example with a patterned polymer resist, during the mechanical abrasion step so that portions 905 are not perforated. A second option is to protect portions 905 with resist during the etch step.

Figure 11:
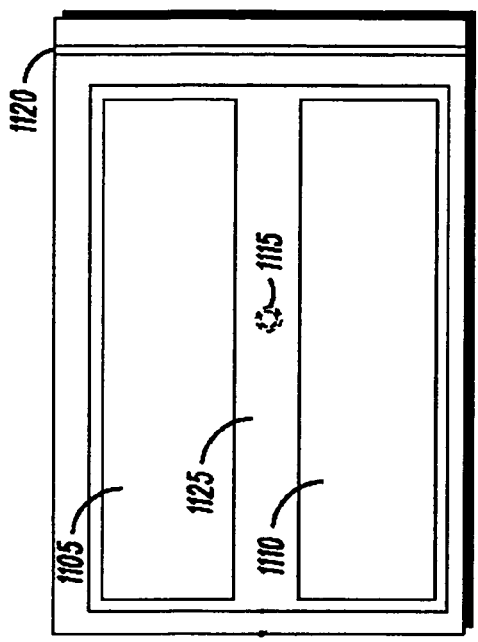

Particular circuit requirements may have a signal coupled to two or more capacitors that are isolated as a group from other capacitors, thereby requiring an area of the first electrode layer 515 for only one via to effect a connection of the bottom electrodes of the group of capacitors to a surface termination, but a circuit runner to the bottom electrode (such as bottom electrode 925) under each isolated capacitor would still be needed. Such features of the bottom electrode are formed with ceramic material from the ceramic oxide layer 510 on top of the features. This is illustrated in FIG. 11, which is a plan view of another portion of the printed circuit sub-structure 500 (not shown in FIG. 14), which has a runner 1120 and two capacitors 1105, 1110 and a first electrode (covered by isolated ceramic oxide core 1125) for the two capacitors, which are isolated from the remainder of the circuits on the printed circuit sub-structure 500. An area 1115 is provided on the isolated ceramic oxide core 1125 for a via to be fabricated that extends down to the first electrode material (shown with dotted lines in FIG. 11).

By this point in these embodiments, a patterned embedded capacitance layer has been formed, comprising the remaining portions of ceramic oxide layer 510, which in the current example include the isolated dielectric core 905, the isolated dielectric core 1125 and the portion of original ceramic oxide layer 510 that remains in region 750.

Because some embodiments of the present invention can provide isolated capacitors of a capacitive density that is so much larger than prior art techniques, the need for capacitors that use shared electrodes and dielectric cores is substantially reduced, but they may be warranted for some situations. As can be seen by this example, some embodiments of the present invention allow for both types.

Figure 12:
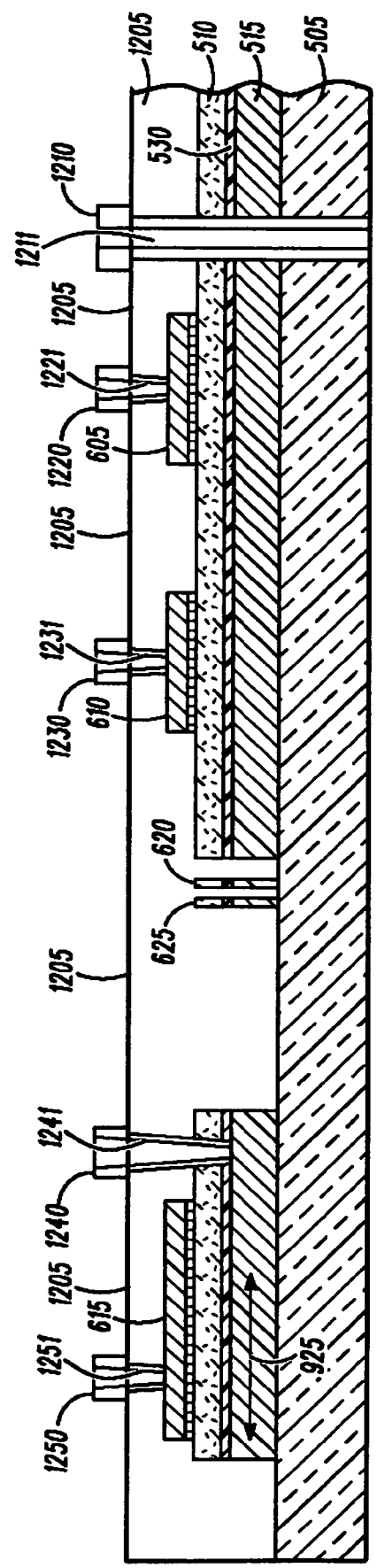

At step 1330 (FIG. 13), exposed surfaces are overlaid with a conformal dielectric material 1205 such as pre-preg or resin-coated foil. FIG. 12 is a cross sectional view of the portion of the printed circuit sub-structure 500 in accordance with some embodiments of the present invention after step 1330 and subsequent steps have been completed. The exposed surfaces include at least the surfaces of the second electrodes 605, 610, 615; the exposed common portion of the crystallized dielectric layer 510 that underlies the second electrodes 605, 610 of the capacitors with shared first electrode and the runners 620, 625; the exposed second electrode 615 of the isolated dielectric core 905; the sides of the isolated dielectric core 905, and exposed areas of the top layer 505 of the printed circuit sub-structure. The conformal material 1205 is any material that has at least some of these properties: it can conformally coat the exposed surfaces, it can provide sufficient dielectric isolation between the coated conductive parts, it can be used to add a new conductive layer to the printed circuit sub-structure, and it can be worked to form electrical vias.

At step 1335 (FIG. 13), terminals 1210, 1220, 1230, 1240, 1250 are formed using blind vias 1221, 1231, 1241, 1251 and plated through hob 1211. Holes for blind vias 1221, 1231, 1251 and plated through hole 1211 are conventional and are formed using conventional techniques such as drilling or by using a laser. The blind via 1241 is unconventional in that it is formed through both the conformal material and the thin ceramic material of the ceramic oxide layer 510. Nonetheless, conventional laser drilling may be used as both $CO_2$ and UV lasers penetrate the ceramic oxide layer. FIG. 12 is a cross sectional view of the portion of the printed circuit sub-structure 500 in accordance with some embodiments of the present invention after step 1335 has been completed. The blind vias 1221, 1231, 1251 are used to make electrical connections to the top electrodes 605, 610, 615. The blind via 1241 is used to make electrical connection to the bottom electrode 925 of the isolated capacitor 910. Alternatively, the blind via 1241 can provide the connection to a shared arrangement of common bottom electrodes of multiple capacitors, such as two capacitors that may electrically couple one input signal to two signal paths. The plated through hole 1211 is used for electrical coupling to the first electrode layer 515 under the entire region 750 (shared portion) of the printed circuit sub-structure 500. The vias and through holes can be formed by conventional techniques and the terminals are added by conventional techniques. In some embodiments, the exposed first electrodes such as electrodes 605, 610, 615 may be used without vias added to them, for direct connection to other conductors.

It will be appreciated that integrated circuits and other electrical components, especially those that are the surface mounted type, may now be economically coupled to isolated capacitors of substantially high capacitance value by using embodiments of the present invention, with very small conductive distances between the terminals of the integrated circuits and other electrical components. For example, the terminal of an integrated circuit could be located directly atop the terminal for the top electrode of an isolated capacitor and another terminal of the same integrated circuit could be located directly atop a terminal coupled to the bottom electrode of the isolated capacitor, in a situation in which the separation of the terminals of the integrated circuit is essentially equal to one side of a capacitor that is square. In such an example, an integrated circuit that is 15 millimeters wide might have a capacitor of some embodiments of the present invention that is approximately 225 square millimeters and that provides on the order of 0.6 micro farads essentially directly coupled to two terminals of the integrated circuit located 15 millimeters apart on opposite side of the integrated circuit. The total length of the conductors between the integrated circuit and the capacitor could be less than 100 microns. Alternatively, ten bypass or decoupling capacitors of value greater than 0.01 microfarad could be coupled to two terminals of an IC using similar extremely short total conductive lengths.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "including" and/or "having", as used herein, are defined as comprising.

What is claimed is:

1. A method for fabricating a patterned embedded capacitance layer, comprising:
   fabricating a ceramic oxide layer having a capacitance density greater than 1000 pF/mm$^2$ overlying a conductive metal layer overlying a printed circuit substrate;
   perforating the ceramic oxide layer within a perforated region; and
   removing the ceramic oxide layer and the conductive metal layer in the perforated region by essentially simultaneously chemically etching the conductive metal layer under the ceramic oxide layer through the perforations and breaking apart and washing away the ceramic oxide layer.

2. The method according to claim 1, wherein the ceramic oxide layer is less than 1.0 micron thick.

3. The method according to claim 1, wherein the ceramic oxide layer comprises materials from the group consisting of lead titanate, lead zirconate, lead magnesium niobate, barium titanate, and strontium titanate.

4. The method according to claim 1, wherein the perforating removes less than 50 percent of the ceramic oxide layer within the perforated region.

5. The method according to claim 1, wherein the conductive metal layer comprises copper, nickel, lead, iron, gold, platinum, chrome, or alloys thereof.

6. The method according to claim 1, wherein the chemical etching is performed using cupric chloride or ammoniacal etch.

7. The method according to claim 1, wherein the ceramic layer is not perforated in at least one non-perforated region and wherein the ceramic oxide layer of each of the least one non-perforated region remains after removing the ceramic oxide layer in the perforated region.

8. The method according to claim 1, wherein the perforating is accomplished by one of mechanical abrasion and laser ablation.

9. The method according to claim 8, wherein the mechanical abrasion comprises one of sandblasting, liquid jet, or ultrasonic abrasion.

10. The method according to claim 1, further comprising forming at least one patterned etch resist area within the perforated region before removing the ceramic oxide layer, wherein the etch resist protects the conductive metal layer in each of the at least one etch resist area from dissolving, resulting in the retention of the ceramic oxide layer within each of the at least one etch resist area.

11. The method according to claim 10, wherein the perforated region comprises substantially the entire ceramic oxide layer.

* * * * *